(12) United States Patent
Mancho-Banuls et al.

(10) Patent No.: US 8,502,462 B2
(45) Date of Patent: Aug. 6, 2013

(54) VOLTAGE DETECTION MODULE

(75) Inventors: Salvador Mancho-Banuls, Colombes (FR); Laurent Nennig, Gramat (FR); Sebastien Pottier, Colombes (FR)

(73) Assignee: Thales (FR)

( * ) Notice: Subject to any disclaimer, the term of this patent is extended or adjusted under 35 U.S.C. 154(b) by 131 days.

(21) Appl. No.: 13/312,153

(22) Filed: Dec. 6, 2011

(65) Prior Publication Data

US 2012/0139432 A1    Jun. 7, 2012

(30) Foreign Application Priority Data

Dec. 7, 2010    (FR) ...................................... 10 04763

(51) Int. Cl.
*H05B 37/00*    (2006.01)
(52) U.S. Cl.
USPC ............ 315/205; 315/208; 315/291; 315/307
(58) Field of Classification Search
USPC ....... 315/205, 208, 209 R, 209 CD, 289–291, 315/303, 287, 209 M
See application file for complete search history.

(56) References Cited

U.S. PATENT DOCUMENTS

| | | | |
|---|---|---|---|
| 3,611,132 A | 10/1971 | Wright et al. | |
| 3,882,388 A | 5/1975 | Nery | |
| 4,385,261 A * | 5/1983 | Kogelschatz et al. | ......... 315/170 |
| 4,393,327 A | 7/1983 | Walters et al. | |
| 4,594,546 A | 6/1986 | Greene et al. | |
| 2009/0085492 A1* | 4/2009 | Siessegger | ................ 315/209 R |
| 2010/0001656 A1* | 1/2010 | Li | ................. 315/289 |
| 2011/0057740 A1* | 3/2011 | Nicole et al. | ................. 333/17.2 |

FOREIGN PATENT DOCUMENTS

FR    2140263    1/1973

OTHER PUBLICATIONS

Foreign Search Report issued in app. No. FR 1004763 (2011).

* cited by examiner

*Primary Examiner* — James H Cho
(74) *Attorney, Agent, or Firm* — Barnes & Thornburg LLP

(57) ABSTRACT

The voltage detection module according to the invention comprises: a first electric terminal; a second ground terminal; a load resistor, connected to the first electric terminal; a main gas-filled spark gap, arranged in series between the load resistor and the second terminal; and a main capacitor, connected, on the one hand, to a first middle point situated between the load resistor and the main gas-filled spark gap and, on the other hand, to the second terminal. The voltage detection module also comprises a light source connected in series between the main gas-filled spark gap and the second terminal, the light source and the main gas-filled spark gap being separate from one another. The voltage detection module comprises an additional stage capable of limiting the voltage applied to the terminals of the gas-filled spark gap to a threshold voltage chosen so as to prevent the gas-filled spark gap from always being on.

11 Claims, 3 Drawing Sheets

VOLTAGE DETECTION MODULE

Figure 1:
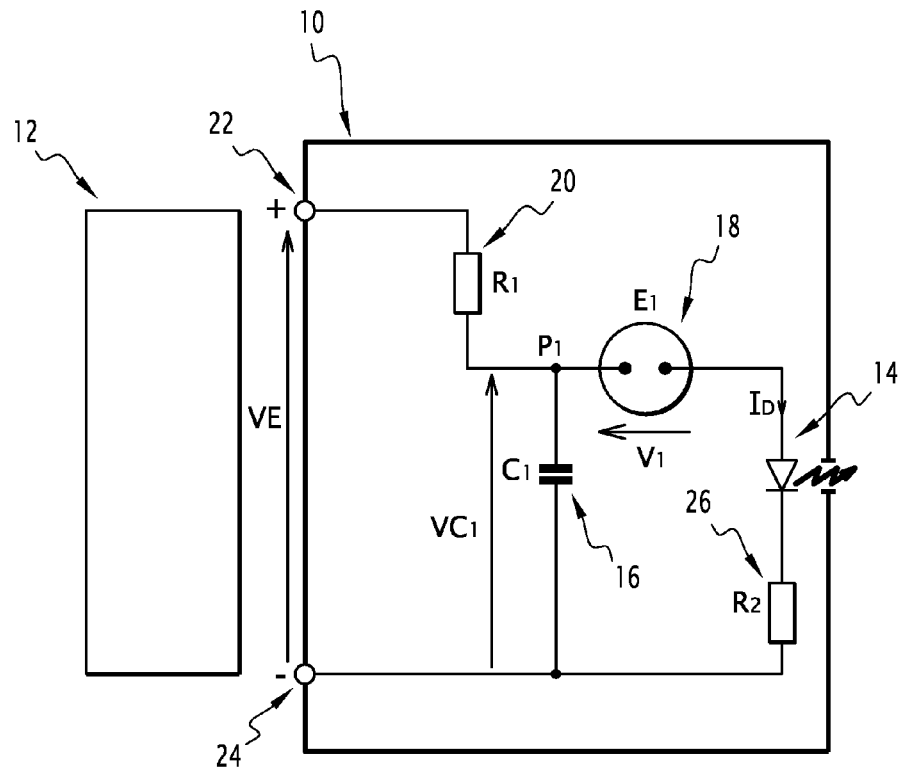

The present invention relates to a voltage detection module comprising:
- a first electric terminal,
- a second ground terminal,
- a load resistor, connected to the first electric terminal,
- a main gas-filled spark gap, arranged in series between the load resistor and the second terminal, and
- a main capacitor, connected, on the one hand, to a first middle point situated between the load resistor and the main gas-filled spark gap and, on the other hand, to the second terminal.

The present invention also relates to a voltage detection system comprising at least one voltage detection module. The field of high-voltage detection requires the use of specific devices such as voltage absence testers (VAT) or voltage detectors (DDT). These devices in particular equip the power banks and serve as security means capable of detecting the residual voltage at the terminals of the capacitors during and after a use of the power bank. These detection devices incorporate detection electronics that make it possible to power a light indicator in the case of a detected voltage above a given threshold voltage. These detection electronics generally comprise a fluorescent lamp forming both a light source, serving as light indicator, and a main gas-filled spark gap connected to a resistor, these components being connected in series between a positive electric terminal and a ground terminal.

Also known from document U.S. Pat. No. 4,594,546A is a voltage detection module comprising a first electric terminal, a second ground terminal, a load resistor, connected to the first electric terminal, a main gas-filled spark gap, arranged in series between the load resistor and the second terminal, and a main capacitor, connected on the one hand to a first middle point situated between the load resistor and the main gas-filled spark gap and, on the other hand, to the second terminal. In that case, the gas-filled spark gap serves as light indicator.

Given their serial architecture, these devices only deliver a limited current to the light indicator during the detection of the presence of voltage.

As a result, the optical power emitted by the light indicator is low and does not make it possible to obtain, under all conditions, sufficient visibility for detection by the human eye or by an equivalent device, which can cause safety problems.

One aim of the invention is therefore to provide a self-powered voltage detection module capable of emitting a light indication sufficient to be detected remotely easily by a person or by any other electronic detection devices.

To that end, the invention relates to a voltage detection module of the aforementioned type, characterized in that it also comprises a light source connected in series between the main gas-filled spark gap and the second terminal, in that the light source and the main gas-filled spark gap are separate from one another, and in that it comprises an additional stage capable of limiting the voltage applied to the terminals of the gas-filled spark gap to a threshold voltage chosen so as to prevent the gas-filled spark gap from always being on.

According to other embodiments, the voltage detection module comprises one or more of the following features, considered alone or according to all technically possible combinations:
- it also comprises a current limiting resistor, connected in series on the one hand to the light source and on the other hand to the ground terminal,
- the light source is an optical diode,
- the additional stage comprises:
  - a stage resistor connected on the one hand to the first middle point and on the other hand to a second middle point, this second middle point being connected to the load resistor,
  - a secondary gas-filled spark gap with a specific starting voltage, connected on the one hand to the second middle point and on the other hand to a third middle point, the starting voltage of which corresponds to the threshold voltage chosen for that additional stage,
  - a secondary capacitor with a specific charge and depletion time, positioned in parallel with the secondary gas-filled spark gap and connected on the one hand to the second middle point and on the other hand to the third middle point, and
  - a secondary resistor, connected on the one hand to the third middle point and on the other hand to the ground terminal.
- the additional stage also comprises an interference suppressor, positioned in parallel with the secondary resistor and connected on the one hand to the third middle point and on the other hand to the ground terminal,
- the values of the resistors and the main capacitor are such that the charge time of the main capacitor is between 50 ms and 500 ms,
- it comprises a plurality of additional stages positioned in parallel between the load resistor and the main stage, a first upstream stage being connected to the load resistor, a last downstream stage being connected to the main stage, each upstream stage having a threshold voltage, corresponding to a protection voltage of the associated downstream stage, higher than the directly-connected downstream stage, so as to limit the voltage at the terminals of each downstream stage, and
- it also comprises an optical fiber, connected at the output of the light source, capable of remotely transmitting a light pulse produced by the light source.

According to another aspect, the invention also relates to a corresponding voltage detection system.

Figure 3:
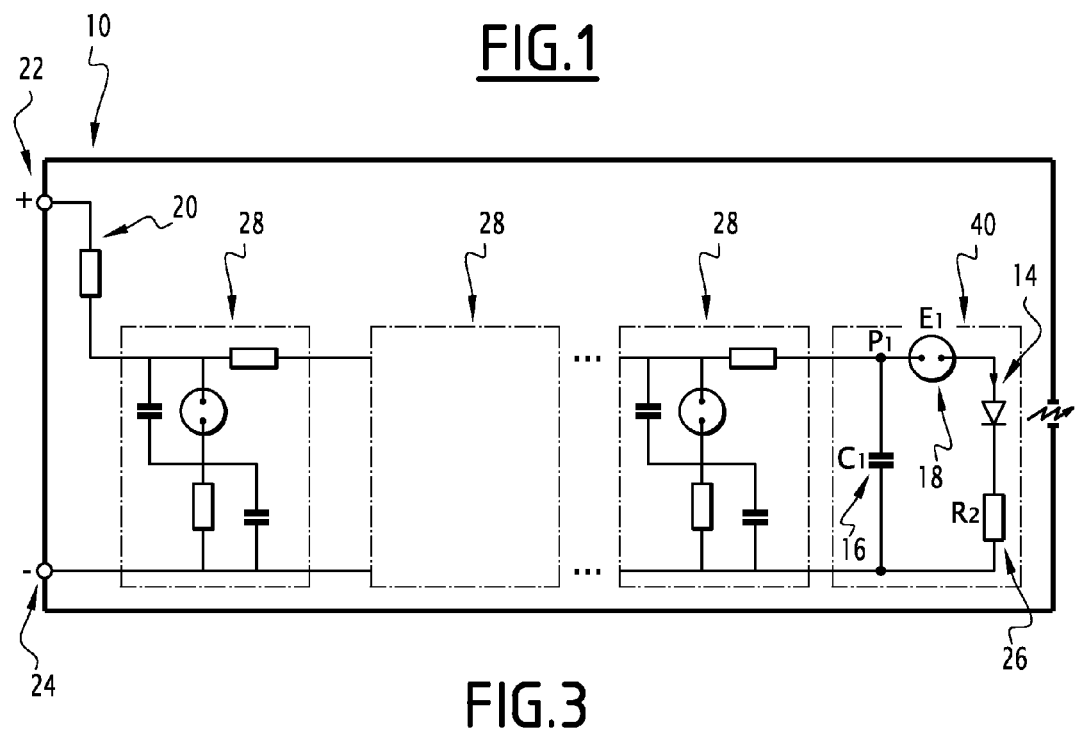
Figure 2:
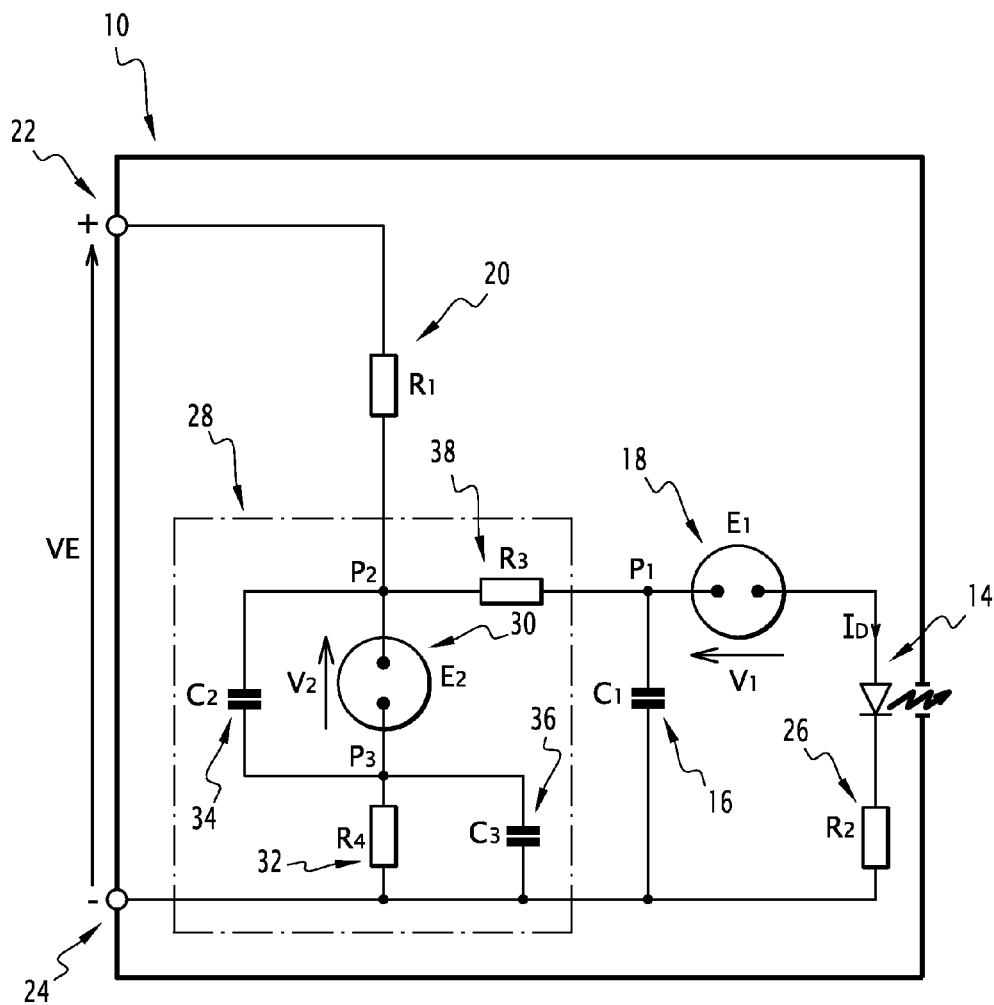
Figure 4:
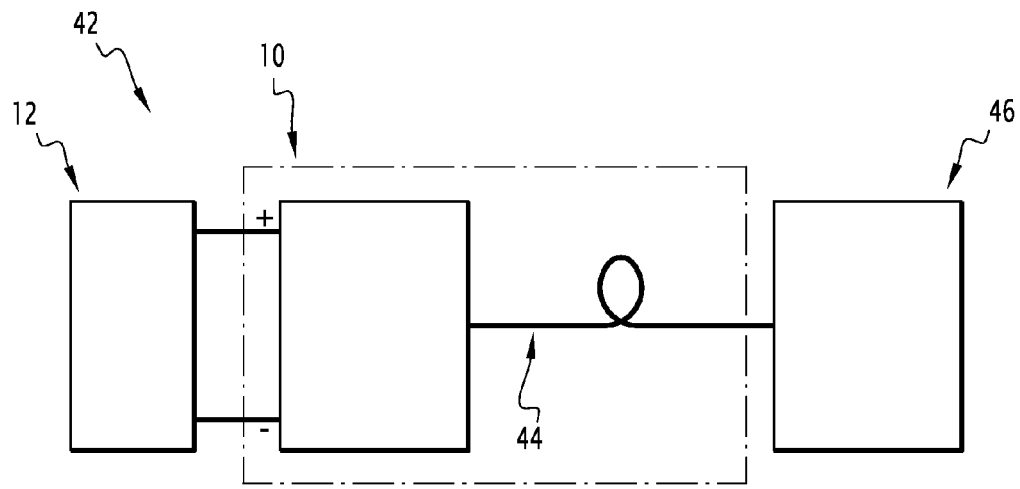
Figure 5:
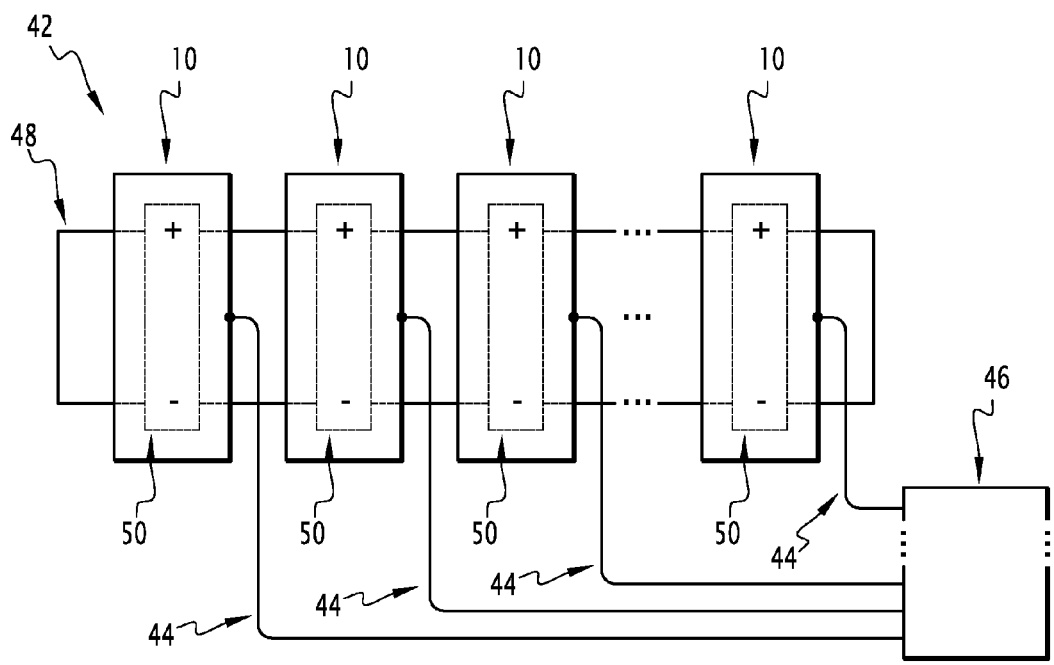

The invention will be better understood upon reading the following description, provided solely as an example and done in reference to the appended drawings, in which:

FIG. 1 is an electronic diagram of a voltage detection module according to a first embodiment of the invention, FIG. 2 is an electronic diagram of a voltage detection module comprising an additional stage according to a second embodiment of the invention, FIG. 3 is an electronic diagram of a voltage detection module comprising a plurality of additional stages according to a third embodiment of the invention, FIG. 4 is a diagrammatic illustration of a voltage detection system comprising a voltage detection module, and FIG. 5 is a diagrammatic illustration of a voltage detection system comprising N voltage detection modules.

The voltage detection module 10 according to the invention, illustrated in FIG. 1, is placed directly on the element to be tested. More specifically, the detection module 10 is placed at the terminals of a load 12, for example a capacitor capable of generating a given voltage.

The module 10 includes a light source 14 such as an optical diode connected to a main capacitor 16 through a gas-filled spark gap 18. More specifically, the capacitor 16 is connected in series with a load resistor 20, through a middle point P1, between a positive charge terminal 22 and a ground terminal 24.

The gas-filled spark gap 18, the optical diode, as well as a current limiting resistor 26 are connected in series to the terminals of the capacitor 16.

The resistor 20 has a high value $R_1$, such as R1>10MΩ, so as to limit the current at the gas-filled spark gap 18. The resistor 26 has a low value $R_2$, such as 50V<$R_2$<200Ω, so as to have a current that is both sufficient to power the diode and not high enough to exceed the maximum allowable intensity for that diode.

As an example, the values of the resistors are such that $R_1$=90MΩ and $R_2$=100Ω. The capacitor 16 has a value C1=100 nF.

Advantageously, the optical diode is a light-emitting diode capable of emitting a visible light luminous radiation.

The operation of the detection module 10, as shown in FIG. 1, will now be described.

The detection module 10 has a two-state operation.

When the voltage $V_E$ applied as input, i.e. between the terminals 22 and 24, of the detection module 10 is lower than a threshold value given by the starting voltage $V_A$ of the gas-filled spark gap 18, the current, passing through the resistor 20, loads the capacitor 16. During the loading, the voltage $V_{C1}$ at the terminals of the capacitor 16 increases until it reaches the value of the voltage $V_E$ applied in input. Then, no current circulating through the diode and the resistor 26, the voltage V1 at the terminals of the gas-filled spark gap 18 corresponds to the voltage at the terminals of the capacitor 16. Since this voltage is lower than the starting voltage $V_A$ of the gas-filled spark gap 18, the spark gap 18 is not triggered and remains an open circuit. Thus, no current $I_D$ powers the optical diode, so that no light radiation is emitted outward.

Consequently, the absence of visible light at the output of the detection module 10 indicates a voltage below the threshold voltage, chosen as a function of the desired security level. For example, in the case of a gas-filled spark gap 18 having a starting voltage $V_A$ of 90 V, the absence of visible light corresponds to a voltage applied in input lower than about 90 V. This case is referred to as an absence of voltage, as the detected voltage levels are not dangerous for users.

When the voltage $V_E$ applied in input, i.e. between the terminals 22 and 24, of the detection module 10 is higher than the chosen threshold voltage, corresponding to the starting voltage $V_A$ of the gas-filled spark gap 18, the capacitor 16 applies, after a certain charge time, a voltage $V_1$, to the terminals of the spark gap 18, higher than said starting voltage $V_A$. A discharge occurs, causing an electric arc, in the gas-filled spark gap 18, which then short circuits. The capacitor 16 discharges quickly through the diode 18, the resistor 26 having a low value. The electric arc in the spark gap is extinguished when the discharge voltage of the capacitor 16 becomes lower than the arc maintaining voltage of the gas-filled spark gap 18, then causing the illumination of the diode to stop. The electric current $I_D$ during the discharge of the capacitor 16 has a typical evolution over time, known by those skilled in the art, and which is close to the shape of a pulse with a current peak such that I=$V_E$/$R_2$.

As an example, taking $R_2$=100Ω and $V_E$=90V, the maximum electrical current $I_D$ passing through the optical diode has a value of approximately 0.9 A, after triggering of the gas-filled spark gap 18. Owing to this electric current $I_D$, the optical diode emits an outward bright visible radiation that also assumes the form of a pulse, in light of the pulsed nature of the current previously described. As long as the voltage applied in input between the terminals 22 and 24 is above the threshold voltage and below a maximum voltage allowing correct extinction of the gas-filled spark gap 18 after triggering, the capacitor 16 alternates the charge and discharge cycles at regular intervals. This alternation thus causes the generation of light pulses by the optical diode at a given frequency. More specifically, the blinking period of the diode is equal to the sum of the charge and discharge time of the capacitor 16. In practice, the discharge time being much lower than the charge time due to the fact that the value of the resistor 26 is very low relative to the value of the resistor 20, the blinking period of the diode is equal to the charge time of the capacitor 16.

Thus, a blinking light is visible in output, informing a user of the presence of a voltage above the threshold voltage, and therefore a hazard.

FIG. 2 illustrates another embodiment of a detection module 10 according to the invention. It includes an additional stage 28 capable of limiting the voltage applied to the terminals of the gas-filled spark gap 18 at a chosen threshold voltage so that the gas-filled spark gap 18 is not always on and so as to be able to use the detector over a wide dynamic range.

The stage 28 comprises a secondary gas-filled spark gap 30 connected, on the one hand, to the resistor 20 and, on the other hand, to a secondary resistor 32. More specifically, the resistor 20, the gas-filled spark gap 30 and the resistor 32 are connected in series between the terminals 22 and 24. A secondary capacitor 34 is connected in parallel with the gas-filled spark gap 30 and is connected on the one hand to an interference suppressor 36 and on the other hand to a stage resistor 38. In detail, the capacitor 36 is connected in parallel with the resistor 32, while the resistor 38 is connected to the gas-filled spark gap 18 through the middle point P1.

The resistors 38, 32 have high values, $R_3$ and $R_4$ respectively, greater than 1 MΩ, and are chosen so that these values R3 and R4 are below the value $R_1$ of the resistor 20. As an example, the values of the resistors are such that $R_3$=$R_4$=$R_1$/3=30 MΩ. The value of the capacitor 34 is chosen so that that value C2 is lower than the value C1 of the capacitor 16 so that the capacitor 34 recovers faster than the capacitor 16. For example, the capacitor 34 has a value $C_2$=470 pF. The value of the capacitor 36 is low, for example $C_3$=100 pF, this capacitor 36 having an interference suppression function. For input voltages $V_E$, between the terminals 22 and 24, lower than the threshold voltage chosen for the additional stage 28, corresponding to the starting voltage of the gas-filled spark gap 30, the operation of the detection module 10, as shown in FIG. 2, is similar to that previously described.

In the case of a voltage applied at the input of the detection module 10 higher than the threshold voltage of the additional stage 28, the gas-filled spark gap 30 is stressed so as to prevent an excessively high voltage and current from being applied to the terminals of the gas-filled spark gap 18, the starting voltage of the gas-filled spark gap 30 being lower than the maintaining voltage of the electric arc of the gas-filled spark gap 18. Thus, the gas-filled spark gap 30 prevents the gas-filled spark gap 18 from always short circuiting, allowing correct extinction of the electric arc.

More particularly, in the case of a voltage $V_E$ applied in input higher than the starting voltage of the gas-filled spark gap 30, for example 4000 V, once the capacitor 34 is loaded, a discharge occurs in the gas-filled spark gap 30, which then short circuits. The capacitor 34 discharges through the gas-filled spark gap 30, which produces a drop in potential at a middle point P2 so that the voltage at the terminals of the capacitor 16, and therefore the voltage $V_1$ at the terminals of the gas-filled spark gaps 18, does not exceed the starting voltage of the gas-filled spark gap 30.

According to the same operating mode as the invention described according to FIG. 1, as long as a voltage higher than the starting voltage of the gas-filled spark gap 18 is applied in input, a blinking of the optical diode, visible in output, occurs that depends on the charge and discharge cycles of the capacitor 16.

Advantageously, the values of the resistor 26 and the capacitor 16 are such that the energy of the capacitor 16 of the primary stage 40 is sufficient for the blinking of the diode to be visible to the human eye.

Thus, according to the embodiment shown in FIG. 2, the detection module 10 has a very broad voltage detection range. As an example, by using two gas-filled spark gaps 18, 30 with a respective starting voltage of 90 V and 3 kV, the detection module 10 has a voltage detecting range varying from 100 V to 40 kV.

Another embodiment of a detection module 10 according to the invention is illustrated in FIG. 3. It includes a plurality of additional stages 28 positioned in parallel between the resistor 20 and the middle point P1, each stage 28 being capable of limiting the voltage at the terminals of the downstream stage 28 to which it is connected.

Main stage 40 refers to the part of the circuit comprising the gas-filled spark gap 18, the optical diode, the resistor 26, and the capacitor 16. A first upstream stage 28 is connected to the resistor 20, a last downstream stage 28 being connected to the main stage 40. Each upstream stage 28 comprises a threshold voltage that corresponds to a protective voltage of the associated downstream stage 28. The threshold voltage of a given upstream stage 28 is higher than the voltage of the downstream stage 26, 40 directly connected so as to limit the voltage at the terminals of each downstream stage 28, 40. The starting voltage of the gas-filled spark gap 30 of each upstream stage 28 corresponds to the threshold voltage chosen for that stage 28 and, as a result, that value is higher than the starting voltage and lower than the maintaining voltage of the electric arc of the gas-filled spark gap 30, respectively 18, of the directly-connected downstream stage 28, respectively 40.

FIG. 4 illustrates a voltage detection system 42 connected to a load 12, for example a capacitor, comprising a detection module 10, as described above, associated with an optical fiber 44, as well as an optical detection and information processing module 46. This module 46 detects light pulses, performs the logic processing thereof after conversion into digital form, and displays the result of the detection.

The voltage detection module 10 comprises an optical fiber 44, connected in output to the optical diode. Advantageously, the optical fiber 44 is a plastic optical fiber. Alternatively, the optical fiber is a silica optical fiber. The other end of the optical fiber 44 is connected to the optical detection and information processing module 46.

In the event voltage is present, at the terminals of the load 12, higher than the threshold voltage, light pulses, generated by the optical diode, are injected into the optical fiber 44 and transmitted remotely. These light pulses are detected, at the module 46, by a photodetector associated with an amplifier, intended to amplify the photocurrent to a sufficient level. The amplifier is connected to an analog-digital converter, thereby making it possible to have information in digital form. This information is sent to a computer capable of performing logic processing on the data and is stored in an internal memory. A button is connected to the computer so as to reset the system. Lastly, a display, connected to the computer and comprising at least one light signal, makes it possible to indicate the presence or absence of voltage at the input of the voltage detection system 42.

As an example, the display comprises two optical diodes of different colors. A first diode, for example red, thus indicates a presence of voltage detected at a given moment since the last reset of the system. A second diode, for example green, on the other hand indicates an absence of voltage detected since the last reset of the system.

The logic processing is done by successively storing a voltage presence indication. More specifically, each time a voltage is detected, its presence is stored in a register of the memory. The computer then sends a control signal to the display, so as to light the light signal corresponding to a presence of voltage. The corresponding light indication remains present until a user erases it by resetting the system, if no residual voltage is again detected. In the case of an absence of detected voltage, another indicator then lights up.

Alternatively, the optical detection and information processing module 46 is capable of determining the frequency of the received light pulses and calculating the voltage at the terminals of the load 12.

More specifically, in the case where the input voltage $V_E$ is lower than the starting voltage of the gas-filled spark gap 30, the repetition frequency of the light pulses follows the equation below:

$$F_{REP}=1/T_{REP}=1/(T_{CHARGE}+T_{DISCHARGE})$$

Where $T_{REP}$: Repetition period of the light pulses, $T_{CHARGE}$: Charge time of the capacitor 16 for the voltage $V_{C1}$ at the terminals of the capacitor 16 to reach the starting voltage of the spark gap 16, and $T_{DISCHARGE}$: Discharge time of the capacitor 16 for the voltage $V_{C1}$ at the terminals of the capacitor 16 to reach 0 V.

The charge time being much longer than the discharge time, the repetition frequency of the light pulses is therefore equal to:

$$F_{REP}=1/T_{CHARGE}$$

The discharge of the capacitor 16 follows the equality: $Q=C_1 \times V_{C1}=I_C \times T_{CHARGE}$ with $I_C=V_E/Z_C$.

Where $V_{C1}$: Voltage at the terminals of the capacitor 16, $V_{C1}$ corresponding to the starting voltage $V_{A1}$ of the spark gap 16 after a charge time, $I_C$: Load current, generated by the load 12, $V_E$: Input voltage, at the terminals of the load 12, and $Z_C$: Impedance seen by the load 12.

Thus, the frequency of the light pulses is therefore:

$$F_{REP}=V_E/(V_{A1} \times C_1 \times Z_C)$$

For example, in the case of FIG. 2, the calculation of the impedance $Z_C$ makes it possible to obtain the following equation:

$$Z_C=R_1+(R_3 \times R_4/R_3+R_4) \text{ and with } R_3=R_4=R_1/3,$$
$$Z_C=R1+R1/6$$

Thus, by choosing $Z_C=R1$ on first approximation, the frequency of the light pulses is therefore:

$$F_{REP}=V_E/(V_{A1} \times C_1 \times R1)$$

For example, if $C_1=100$ nF, $R_1=90\Omega$, $V_{A1}=90$V:

$$F_{REP}=V_E/810 \text{ or } V_E=810 \times F_{REP}$$

Consequently, measuring the frequency of the light pulses makes it possible to determine the input voltage $V_E$, present between the terminals 22 and 24.

For voltage measurements higher than the starting voltage of the gas-filled spark gap 30, the voltage detection system 42 also comprises a diode in series with the gas-filled spark gap 30 for each additional stage 28, and means for detecting the lighting frequency of that diode, which corresponds to short circuiting the gas-filled spark gap 30 of the additional stage 28 during operation. The voltage calculating means are capable, following the same principle as previously described, of establishing the input voltage $V_E$ as a function of the starting voltage $V_{A2}$ of the gas-filled spark gap 30 of the additional stage 28 during operation, values R1 of the resistor 20 and C2 of the capacitor 34 and the measured repetition frequency.

Thus, the input voltage $V_E$ is therefore:

$$V_E = F_{REP} \times (V_{A2} \times C_2 \times R1)$$

FIG. 5 shows a voltage detection system 42 associated with a power bank 48 comprising N high-voltage capacitors 50. This system 42 is capable of detecting a presence of voltage at the terminals of any one of the capacitors 50. A detection module 10 is connected to the terminals of each capacitor 48. Consequently, the voltage detection system 42 comprises N detection modules 10 whereof each optical fiber 44 is connected to an input of the detection and information processing module 46. The detection module 46 therefore comprises N inputs, all connected one by one to photoreceivers provided with amplifiers in output. These amplifiers are connected one by one to a digital-analog converter. Following the same principle as for FIG. 4, the detection module 46 also comprises a computer, an internal memory, a button and a display.

Alternatively, the display comprises three optical diodes of different colors. The first two diodes, red and green, for example, operate on a principle similar to that previously described. Thus, the red diode indicates the presence of voltage detected at the terminals of at least one capacitor 50, while the green diode indicates an absence of voltage detected at the terminals of all of the capacitors 50. The third diode, orange, for example, indicates a voltage presence detected on all of the capacitors 50. All of these indications correspond to a detection since the last reset of the system.

According to the same operating mode as for the system 42 described in FIG. 4, each time a voltage is detected on any one of the capacitors 50, the optical diode of the corresponding module 10 generates light pulses that are transmitted by the optical fiber 44 to the corresponding input of the module 46. The light pulses are received at the photoreceiver, associated with the input, which converts those optical pulses into analog current pulses. After amplification and digital conversion, this information is sent to the computer and a voltage presence indication is stored in a dedicated register of the memory. The computer generates a control signal toward the display, so as to light up the corresponding light signal. That light signal remains lit until a user presses the system reset button. Pressing that button sends a message to the computer to erase all of the registers from the memory and an extinction signal is sent by the computer to the display in the event no voltage is detected on one of the capacitors, which makes it possible to turn off the light signal previously lit. At the same time, if no voltage is detected on any of the capacitors 50, the computer sends a signal to the display so as to light up another light signal, synonymous with the absence of voltage, higher than the starting voltage $V_A$ of the stage 40 at the system 42.

For example, in the case of the use of a detection module 46, using optical diodes such as light signals at the display, associated with a power bank comprising 300 capacitors 50 at an operating voltage of 24 kV, once a voltage is detected on at least one of the capacitors 50, the red diode lights up, thereby warning the users of a hazard. Only resetting the system, by manual pressing by the user, makes it possible to extinguish that light, if no residual voltage is still present on one of the capacitors 50. Furthermore, if no more voltage is detected on any one of the capacitors 50, the green light lights up, then informing users of a complete absence of danger.

In this way, the voltage detection module 10, as security means, has the advantage of being self-sufficient due to its lack of power source. Using optical fibers also allows very good galvanic isolation by making the security information reliable and safe by doing away with any electromagnetic couplings in a severe high-voltage environment. Furthermore, the architecture of the module 10 allows operation over a wide usage range. Lastly, the system 42 allows automatic detection of the state of the voltages at different locations, allowing an improvement in terms of security and ease of use. In fact, relative to systems for verifying the absence of current voltages, the system 42 makes it possible to avoid performing manual unit verifications of each load.

The invention claimed is:

1. A voltage detection module comprising:
    a first electric terminal;
    a second ground terminal;
    a load resistor, connected to the first electric terminal;
    a main gas-filled spark gap, arranged in series between the load resistor and the second terminal; and
    a main capacitor, connected, on the one hand, to a first middle point situated between the load resistor and the main gas-filled spark gap and, on the other hand, to the second terminal, characterized in that it also comprises a light source connected in series between the main gas-filled spark gap and the second terminal, in that the light source and the main gas-filled spark gap are separate from one another, and in that it comprises an additional stage capable of limiting the voltage applied to the terminals of the gas-filled spark gap to a threshold voltage chosen so as to prevent the gas-filled spark gap from always being on.

2. A voltage detection module according to claim 1, further comprising a current limiting resistor, connected in series on the one hand to the light source and on the other hand to the ground terminal.

3. A voltage detection module according to claim 2, further comprising the light source is an optical diode.

4. A voltage detection module according to claim 1, the additional stage comprising:
    a stage resistor connected on the one hand to the first middle point and on the other hand to a second middle point, this second middle point being connected to the load resistor;
    a secondary gas-filled spark gap with a specific starting voltage, connected on the one hand to the second middle point and on the other hand to a third middle point, the starting voltage of which corresponds to the threshold voltage chosen for that additional stage;
    a secondary capacitor with a specific charge and depletion time, positioned in parallel with the secondary gas-filled spark gap and connected on the one hand to the second middle point and on the other hand to the third middle point; and
    a secondary resistor, connected on the one hand to the third middle point and on the other hand to the ground terminal.

5. A voltage detection module according to claim 4, wherein the values of the resistors, and the main capacitor are such that the charge time of the main capacitor is between 50 ms and 500 ms.

6. A voltage detection module according to claim 4, further comprising a plurality of additional stages positioned in parallel between the load resistor and the main stage, a first upstream stage being connected to the load resistor, a last downstream stage being connected to the main stage, each upstream stage having a threshold voltage, corresponding to a protection voltage of the associated downstream stage, higher than the directly-connected downstream stage, so as to limit the voltage at the terminals of each downstream stage.

7. A voltage detection module according to claim 1, further comprising an interference suppressor, positioned in parallel with the secondary resistor and connected on the one hand to the third middle point and on the other hand to the ground terminal.

8. A voltage detection module according to claim 1, further comprising an optical fiber, connected at the output of the light source, capable of remotely transmitting a light pulse produced by the light source.

9. A voltage detection system comprising at least one voltage detection module according to claim 8, further comprising an optical detection and information processing module, connected to the optical fiber of each voltage detection module, capable of detecting the light pulse received in output from each optical fiber and determining the presence of voltage at the terminals of each voltage detection module.

10. A voltage detection system according to claim 9, wherein the optical detection and information processing module is capable of determining the frequency of the received light pulses and calculating the voltage present between the terminals, as a function of the frequency of the light pulses.

11. A voltage detection system according to claim 10, wherein the voltage detection module also comprises a light source in series with the secondary gas-filled spark gap of the or each additional stage and in that the optical detection and information processing module is capable of determining the frequency of the light pulses received from the or each light source of the or each additional stage during operation and calculating the voltage present between the first and second terminals, as a function of the determined frequencies.

* * * * *